United States Patent [19]

Brown

[11] 4,447,776

[45] May 8, 1984

[54] PULSE DRIVER FOR FLUX GATE MAGNETOMETER

[75] Inventor: Robert E. Brown, Silver Spring, Md.

[73] Assignee: The United States of America as represented by the Secretary of the Navy, Washington, D.C.

[21] Appl. No.: 256,868

[22] Filed: Apr. 24, 1981

[51] Int. Cl.³ .............................................. G01R 33/04
[52] U.S. Cl. ...................... 324/253; 324/255; 331/112
[58] Field of Search ........... 324/253, 254, 255, 117 R; 331/112; 307/275, 314

[56] References Cited

U.S. PATENT DOCUMENTS

| | | | |
|---|---|---|---|
| 2,957,145 | 10/1960 | Bernstein | 331/112 |
| 3,334,619 | 8/1967 | Penn | 331/112 |
| 3,394,272 | 7/1968 | Fischman | 331/112 |
| 3,427,534 | 2/1969 | Maxwell | 324/117 R |
| 3,491,281 | 1/1970 | Penn | 331/112 |
| 3,509,424 | 4/1970 | Inouye | 324/254 |
| 3,649,908 | 3/1972 | Brown | 324/43 G |
| 3,681,711 | 8/1972 | Hanby | 307/275 |
| 3,809,994 | 5/1974 | Ehni | 331/112 |
| 3,882,387 | 5/1975 | Vikstrom | 324/117 R |
| 4,277,751 | 7/1981 | Lawson et al. | 324/254 |
| 4,349,752 | 9/1982 | Forte | 307/314 |
| 4,384,254 | 5/1983 | Brown | 324/253 |

*Primary Examiner*—Gerard R. Strecker
*Assistant Examiner*—Warren S. Edmonds

[57] ABSTRACT

A driver circuit for a fluxgate magnetometer has a repetition rate controllable independent of the magnetometer core winding inductances, and a current-ON interval terminated only by core saturation. In this manner, power consumption is greatly reduced as compared to prior magnetometers without sacrificing low-noise operation. Previous drivers operated in a free-running flyback mode at high pulse repetition rates. The present driver reduces the oscillator repetition rate, and power consumption, by the use of a control loop from the flyback oscillator which signals the end of a current pulse as the magnetometer core rebounds from the saturated state.

8 Claims, 4 Drawing Figures

PULSE DRIVER FOR FLUX GATE MAGNETOMETER

BACKGROUND OF THE INVENTION

The present invention relates to drivers for fluxgate magnetometers and more particularly to a low power, low noise, unidirectional pulse driver.

Fluxgate magnetometers require that electrical current be supplied periodically to a winding to magnetically saturate the magnetometer core. The presence of an applied magnetic field, such as the earth's field or the field of a magnetic body, is detected by sense windings on the magnetometer core as the core cycles in and out of saturation producing a time-varying permeability. This process consumes some energy E per cycle. Magnetic material volume and other material parameters as well as core geometry and drive circuit efficiency control the magnitude of this energy. Expenditure of energy E permits one sample of the ambient magnetic field amplitude to be registered in an output circuit and given a numerical value. This numerical value varies from cycle to cycle because of fluctuations in the magnetic material parameters and in the circuitry supplying the saturation drive current. If N samples per second are taken and averaged, a more stable value for the field measurement is obtained in some desired bandwidth. For a specified bandwidth and field measurement instability (noise), a power N·E must be continuously expended to operate the magnetometer. If the noise is uncorrelated from cycle to cycle, a specific core and driving circuit yield, by the averaging process, a magnetometer signal-to-noise ratio proportional to $\sqrt{N}$.

Prior art energy efficient magnetometer drivers include devices such as the oscillator described in U.S. Pat. No. 3,649,908. The oscillator described therein operates in the free-running flyback mode, i.e., the ON interval of the transistor switch is substantially longer than the OFF interval. The repetition rate or frequency of the oscillator is largely determined by the supply voltage V and the inductance $L_1$ of the magnetometer drive winding. In typical implementations, this frequency maybe 20 KHz to 50 KHz and the power consumption about 5 milliwatts. This oscillator is a stable, efficient, and low-noise source of the current pulses necessary for polarizing the magnetic core in fluxgate magnetometers. Its major drawback is the high repetition rate which fixes the sampling rate of the magnetometer and also its power consumption. For detection of slowly changing magnetic signals, a sampling rate of a few hundred Hertz would be adequate. The sampling rate required to yield an adequate signal-to-noise ratio depends on the application. When operating in the free-running flyback mode, the oscillator produces a magnetometer with about ¼ gamma noise. If the repetition rate could be reduced by a factor of ten without changing the desirable features of the oscillator, power consumption would be reduced to one-tenth and noise increased by perhaps the $\sqrt{10}$ to slightly less than one gamma.

Copending application Ser. No. 157,925 now U.S. Pat. No. 4,384,254, entitled Micro-Power Magnetometer, filed by the present inventor on June 6, 1980, discloses an attempt at decreasing the oscillator repetition rate (to thereby reduce the product N·E) by using the closely related blocking oscillator as a driver. This implementation produced a useful magnetometer with very low power consumption, near 100 microwatts. The low-noise features of the flyback mode of oscillation were sacrificed, however, and noise was much higher than predicted from the square root of the ratio of repetition rates.

As set forth in application Ser. No. 157,925, features of a driving oscillator deemed necessary for fluxgate magnetometer operation at very low power expenditure are (1) a repetition rate controllable independent of core winding inductances and (2) a driving current-on interval terminated only by core saturation.

The magnetometer driver of the present invention, as will more fully appear below, retains the low power features of the blocking oscillator driver while at the same time retaining the low noise feature of the flyback mode of operation.

SUMMARY OF THE INVENTION

It is therefore an object of the present invention to provide a low power consumption, low noise driver for a fluxgate magnetometer.

It is a further object of the present invention to provide a unidirectional pulse driver for a fluxgate magnetometer comprising an oscillator operating in the flyback mode with the pulse repetition rate controlled independently of core winding inductances and the driving current-on interval terminated only by core saturation.

It is another object of the present invention to reduce the pulse repetition rate of a unidirectional pulse driver for a fluxgate magnetometer, to thereby decrease power consumption without unacceptably increasing internal noise.

It is a still further object of the present invention to provide a unidirectional pulse driver for a fluxgate magnetometer wherein the pulse length may vary as the applied magnetic field varied but wherein the pulse repetition rate is independently controlled.

It is still another object of the present invention to independently control the current-on and the current-off periods of a fluxgate magnetometer driver.

Briefly, the above and other objects of the present invention are accomplished by the provision of a transistor flyback oscillator fluxgate magnetometer driver wherein the base resistor of the oscillator is disconnected from ground upon completion of a flyback pulse by disabling a keying circuit controlling the connection of the resistor. The keying circuit is disabled by the provision of a control loop coupling the regenerative pulse appearing in the oscillator feedback winding following core saturation to the keying circuit. A latching circuit is provided to maintain the keying circuit disabled thereafter for a selectable period to thereby control the pulse repetition rate of the oscillator.

BRIEF DESCRIPTION OF THE DRAWINGS

A more complete appreciation of the present invention and many of the attendant advantages thereof will be readily understood by reference to the following detailed description when considered with the accompanying drawings wherein.

Figure 4:
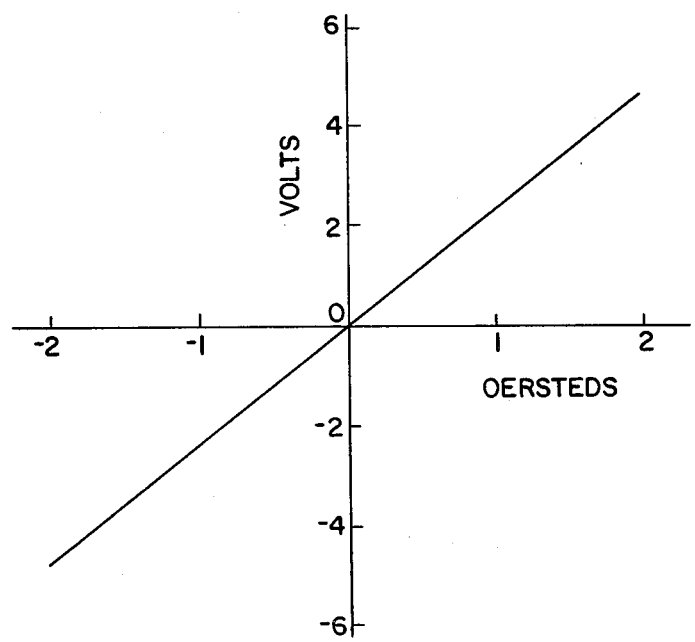

FIG. 4 is a plot of magnetometer output as a function of applied field.

DETAILED DESCRIPTION OF THE PREFERRED EMBODIMENT

Figures 1, 3:
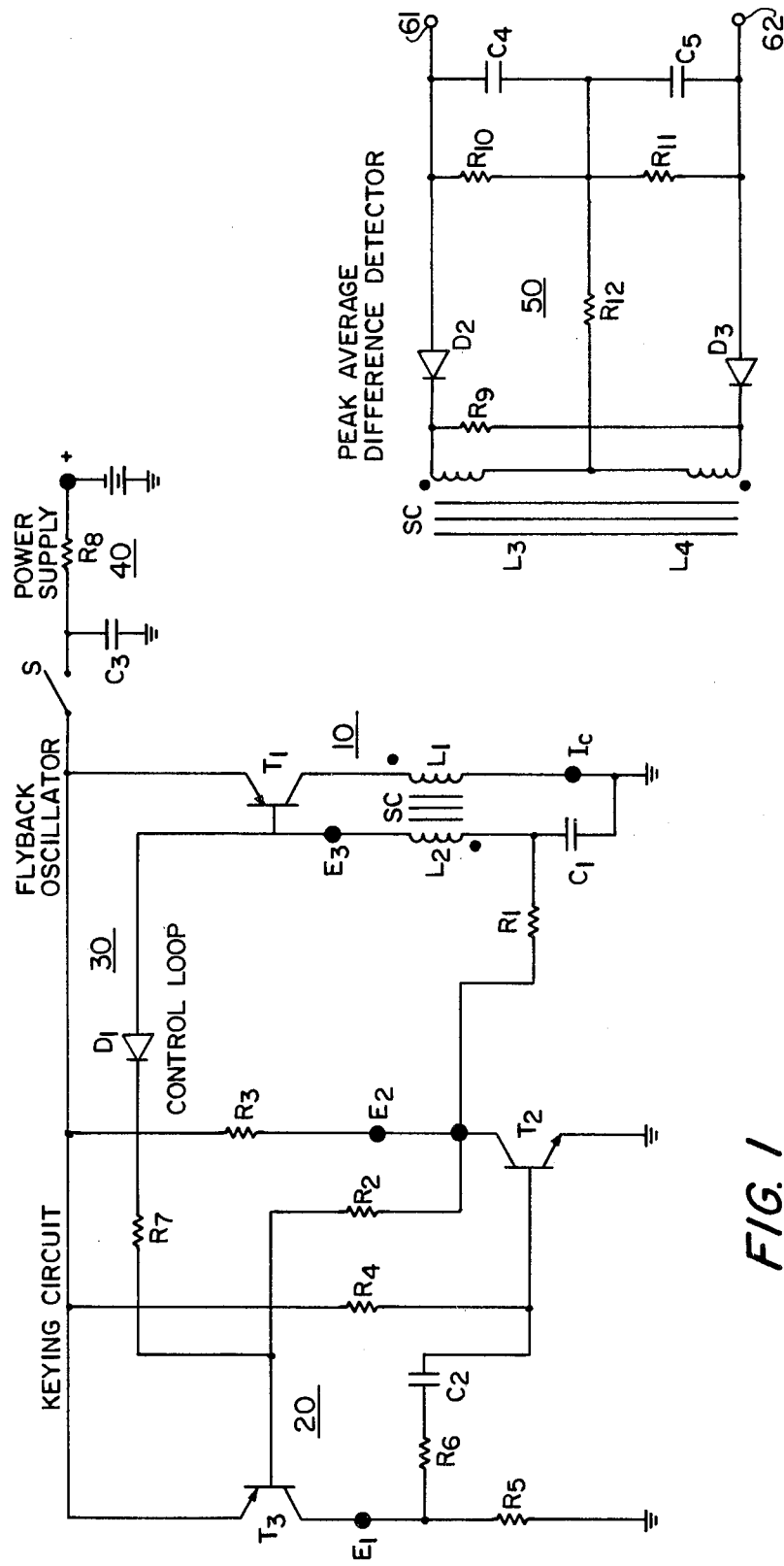
FIG. 1 is a circuit diagram of an illustrative embodiment of the invention.
FIG. 3 is a circuit diagram of a peak average difference detector driven by the pulse driver of FIG. 1 which together with the pulse driver comprises a single axis fluxgate magnetometer.

Referring now to FIG. 1, which illustrates a preferred embodiment, there is shown a flyback oscillator 10, a keying circuit 20, a control loop 30, and a power supply 40.

Flyback oscillator 10 includes a winding $L_1$, wound evenly over 360° of a high permeability ring core SC, coupling the collector of a PNP transistor $T_1$ to ground. Winding $L_1$ may comprise the drive winding of a magnetometer. The emitter of $T_1$ is connected to the power supply. A feedback winding $L_2$, also wound evenly over 360° of the ring core, couples the base of transistor $T_1$ to ground through a capacitor $C_1$. One end of a resistor $R_1$ is connected to the juncture of feedback winding $L_2$ and capacitor $C_1$. Feedback winding $L_2$ is further connected to control loop 30 for a purpose to be later described.

Keying circuit 20 comprises an NPN transistor $T_2$ having the emitter thereof connected to ground and the collector connected to the other end of resistor $R_1$, to one end of a resistor $R_2$, and to the power supply through a resistor $R_3$. The base of transistor $T_2$ is connected to the power supply through a resistor $R_4$. The keying circuit further comprises a PNP transistor $T_3$ having the emitter thereof connected to the power supply, the collector connected to ground through a resistor $R_5$, and the base connected to the other end of resistor $R_2$ and to control loop 30. A latching circuit comprising a series connected resistor $R_6$ and a capacitor $C_2$ couples the juncture of the collector of transistor $T_3$ and resistor $R_5$ to the base of transistor $T_2$.

Control loop 30 comprises a series connected diode $D_1$ and resistor $R_7$ coupling feedback winding $L_2$ to the base of transistor $T_3$.

Finally, power supply 40 comprises a source of positive potential, such as a battery 41, and a filter network comprising a resistor $R_8$ and a capacitor $C_3$. The filter circuit is provided to isolate the pulse driver from power supply noise, to which it is somewhat sensitive.

Figure 2:
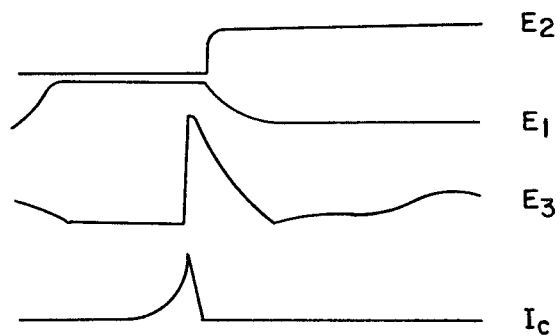
FIG. 2 illustrates single pulse voltage and current waveforms occurring at various places in the circuit of FIG. 1.

Referring now to FIGS. 1 and 2, when the pulse driver is connected to the power supply by switch S transistor $T_2$ will conduct thereby effectively grounding resistors $R_1$ and $R_2$ (See $E_2$, FIG. 2). Flyback oscillator 10 is now enabled and generates a flyback pulse $I_c$. At the same time, transistor $T_3$ is enabled whereby capacitor $C_2$ is charged to a potential $E_1$. At the completion of the flyback pulse, determined by core saturation, the core rebounds from saturation generating a positive going spike $E_3$ in feedback winding $L_2$ that is coupled to the base of transistor $T_3$ through control loop 30 turning the transistor off. This action, together with the negative potential applied to the base of transistor $T_2$ by the charged capacitor $C_2$, maintains transistor $T_2$ cut off until capacitor $C_2$ discharges through resistor $R_4$. The period of time that transistor $T_2$ is disabled is thus determined by the RC time constant. After capacitor $C_2$ discharges, transistor $T_2$ is again enabled and the cycle repeats.

There has thus been provided a flyback oscillator pulse driver for a fluxgate magnetometer wherein the flyback pulse is terminated only by core saturation and the pulse repetition rate is controlled independently of core winding inductance. In addition, isolated single pulses are produced at a repetition period longer than the natural period of a free running flyback oscillator. Thus, the actual repetition rate of the oscillator has been reduced to lower power consumption while at the same time the relatively low noise feature of the flyback mode of operation has been retained.

While not part of the invention, a peak average difference detector driven by the pulse driver of FIG. 1 is shown in FIG. 3 for completeness of disclosure. The detector together with the pulse driver comprise a single axis fluxgate magnetometer.

Referring now to FIG. 3, a pair of magnetic field sense windings $L_3$, $L_4$ are wound evenly about 180° segments of ring core SC and connected to null the driver signal across output terminals 61, 62 so that only the applied field signal appears at the output terminals. Diodes $D_2$, $D_3$ are poled to conduct when the core magnetization collapses following polarization. Capacitors $C_4$, $C_5$ and resistors $R_{10}$, $R_{11}$ are connected to form a pair of leaky integrators coupled respectively across sense windings $L_3$, $L_4$ to provide an average difference of the voltage pulses, appearing at these windings on the core halves. Resistors $R_9$, $R_{12}$ are provided for tuning and current limiting purposes. As may be seen by reference to FIG. 4, the linearity of the magnetometer over the range of interest is quite good.

If it is desired to have a two axis magnetometer, the circuit of FIG. 3 would be duplicated and the sense windings would be wound over opposite 90° segments of the core. Since the detector is powered only by the pulse driver, no additional power consumption would be required.

One constructed embodiment of the invention used a 5.4 volt power supply and the following component values and types:

| | | | | | | | |
|---|---|---|---|---|---|---|---|
| $R_1$ | 12K | $R_8$ | 10K | $C_3$ | 10 $\mu$F | $D_2$ | 1N4454 |
| $R_2$ | 100K | $R_9$ | 3K | $C_4$ | 0.01 $\mu$F | $D_3$ | 1N4454 |
| $R_3$ | 100K | $R_{10}$ | 2Meg | $C_5$ | 0.01 $\mu$F | $L_1$ | 1500 turns |
| $R_4$ | 1Meg | $R_{11}$ | 2Meg | $D_1$ | 2N2906A | $L_2$ | 100 turns |
| $R_5$ | 100K | $R_{12}$ | 1K | $T_2$ | 2N3565 | $L_3$ | 400 turns |
| $R_6$ | 10K | $C_1$ | 0.0056 $\mu$F | $T_3$ | 2N5086 | $L_4$ | 400 turns |
| $R_7$ | 5.6K | $C_2$ | 0.001 $\mu$F | $D_1$ | 1N4454 | | |

All magnetometer windings were formed of No. 36HF wire toroidally wound on a moly-permalloy bobbin core and insulated from the core by Teflon or Mylar tape. The core used was obtained from Infinetics, Inc., Wilmington, Del., as part #S625C31-HC-2074C. Similar cores are available from other manufacturers, Arnold Engineering, Marengo, Ill., part #25538P500-010, Magnetics, Inc., Butler, Pa., part #80656-1/2D-025-1. The parameters of the Infinetics core as follows:

4-79 moly-permalloy tape, $\frac{1}{2}$ mil thick, 1/16" wide, 10 tape wraps on a $\frac{5}{8}$" diameter stainless steel bobbin.
Saturation flux = 13 to 15 Maxwells
$H_c$ = 0.1 oersted at 60 hertz
Squareness = $B_r/B_m$ = 75 to 85%.

The specific magnetometer described above, has a 1500 $H_z$ pulse repetition rate, a power consumption of 0.3 milliwatts, and about 0.6 gamma internal noise for a 1.5 oersted applied field and a bandwidth of 0.03 to 3 Hz. The sensitivity is about 25 microvolts/gamma and the output impedance is 700 K.

Obviously, numerous modifications and variations of the present invention are possible in the light of the above teachings. For example, integrated circuit gated multivibrator may by used in place of the keying circuit disclosed. It is therefore to be understood that within the scope of the appended claims the invention may be practiced otherwise then as specifically described.

What is claimed as new and desired to be secured by Letters Patent of the United States is:

1. A pulse driver for a fluxgate magnetometer comprising:
   a saturable core having first and second windings thereon,
   a pulse generator coupled to said first winding operable to provide a core saturating pulse to said winding,
   a keying circuit coupled to said pulse generator continuously operable to disable said generator when actuated and to enable and subsequently disable said pulse generator after a period of time,
   a control circuit coupled to said second winding and to said keying circuit operable to actuate said keying circuit upon the occurrence of a regenerative pulse in said second winding following core saturation.

2. The pulse driver of claim 1 wherein said pulse generator is a flyback oscillator and wherein said second winding is the feedback winding of said oscillator, comprising:
   a PNP junction transistor having the emitter thereof coupled to a power supply, the collector coupled to ground by said first winding, and the base coupled to ground through said feedback winding and a capacitor,
   a resistor having one end thereof connected to the juncture of said feedback winding and said capacitor and the other end connectable to ground by said keying circuit,
   whereby said keying circuit is continuously operable to selectively enable and subsequently disable said oscillator.

3. The pulse driver of claim 2 wherein said keying circuit comprises:
   an NPN junction transistor having the collector thereof connected through a resistor to the power supply and to the other end of said first recited resistor the emitter connected to ground, and the base connected through a resistor to the power supply;
   a PNP junction transistor having the emitter thereof connected to the power supply, the collector coupled through a resistor to ground, and the base connected through a resistor to the collector of said NPN transistor; and
   a capacitor connecting the collector of said PNP transistor to the base of said NPN transistor; and wherein,
   said control circuit comprises a diode connecting said feedback winding to the base of said PNP transistor.

4. The pulse driver of claim 3 wherein said core is a ring core.

5. A fluxgate magnetometer comprising:
   a saturable core having first and second windings thereon wherein said first winding is the drive winding of said magnetometer,
   a pulse generator coupled to said drive winding operable to provide a core saturating pulse to said winding,
   a keying circuit coupled to said pulse generator operable to disable said generator continuously when actuated and to enable said pulse generator after a period of time,
   a control circuit coupled to said second winding and to said keying circuit operable to actuate said keying circuit upon the occurrence of a regenerative pulse in said second winding following core saturation,
   magnetometer sense windings on said core,
   output terminals, and
   circuit means coupling said sense windings to said output terminals.

6. The magnetometer of claim 5 wherein said pulse generator is a flyback oscillator and wherein said second winding is the feedback winding of said oscillator, comprising:
   a PNP junction transistor having the emitter thereof coupled to a power supply, the oscillator coupled to ground by said drive winding, and the base coupled to ground through said feedback winding and a capacitor,
   a resistor having one end thereof connected to the juncture of said feedback winding and said capacitor and the other end connectable to ground by said keying circuit,
   whereby said keying circuit is continuously operable to enable and subsequently disable said oscillator.

7. The magnetometer of claim 6 wherein said keying circuit comprises an NPN junction transistor having the collector thereof connected through a resistor to the power supply and to the other end of said first recited resistor, the emitter connected to ground, and the base connected through a resistor to the power supply;
   a PNP junction transistor having the emitter thereof connected to the power supply, the collector coupled through a resistor to ground, and the base connected through a resistor to the collector of said NPN transistor; and,
   a capacitor connecting the collector of said PNP transistor to the base of said NPN transistor; and wherein,
   said control circuit comprises a diode connecting said feedback winding to the base of said PNP transistor.

8. The magnetometer of claim 7 wherein said core is a ring core.

* * * * *